United States Patent
Kang et al.

(10) Patent No.: US 8,058,221 B2
(45) Date of Patent: Nov. 15, 2011

(54) COMPOSITION FOR REMOVING A PHOTORESIST AND METHOD OF MANUFACTURING SEMICONDUCTOR DEVICE USING THE COMPOSITION

(75) Inventors: Dong-Min Kang, Seoul (KR); Dongchan Bae, Suwon-si (KR); Kyoochul Cho, Yongin-si (KR); Baiksoon Choi, Anyang-si (KR); Seunghyun Ahn, Suwon-si (KR); Myungkook Park, Siheung-si (KR); Goun Kim, Suwon-si (KR)

(73) Assignees: Samsung Electronics Co., Ltd., Suwon-Si (KR); Cheil Industries Inc., Gumi-Si (KR)

( * ) Notice: Subject to any disclaimer, the term of this patent is extended or adjusted under 35 U.S.C. 154(b) by 0 days.

(21) Appl. No.: 13/080,763

(22) Filed: Apr. 6, 2011

(65) Prior Publication Data

US 2011/0245128 A1 Oct. 6, 2011

(30) Foreign Application Priority Data

Apr. 6, 2010 (KR) .................. 10-2010-0031475
Oct. 22, 2010 (KR) .................. 10-2010-0103531

(51) Int. Cl.
*C11D 7/50* (2006.01)
(52) U.S. Cl. ....................... 510/175; 510/176
(58) Field of Classification Search .................. 510/175, 510/176
See application file for complete search history.

(56) References Cited

U.S. PATENT DOCUMENTS

| | | | | |
|---|---|---|---|---|
| 6,797,682 B2* | 9/2004 | Hara et al. | ................... | 510/175 |
| 6,869,921 B2* | 3/2005 | Koito et al. | ................... | 510/176 |
| 6,916,772 B2* | 7/2005 | Zhou et al. | ................... | 510/201 |
| 7,049,275 B2* | 5/2006 | Ikemoto et al. | ............... | 510/176 |
| 7,051,742 B2 | 5/2006 | Lee et al. | | |
| 7,144,849 B2 | 12/2006 | Lee et al. | | |
| 7,543,592 B2* | 6/2009 | Lee | .............................. | 134/1.3 |
| 7,579,308 B2* | 8/2009 | Lee | .............................. | 510/175 |
| 7,674,755 B2* | 3/2010 | Egbe et al. | ................... | 510/175 |
| 7,960,328 B2* | 6/2011 | Visintin et al. | ............... | 510/175 |
| 7,968,507 B2* | 6/2011 | Lee et al. | ...................... | 510/175 |
| 2002/0128164 A1* | 9/2002 | Hara et al. | ................... | 510/175 |
| 2003/0130147 A1* | 7/2003 | Koito et al. | ................... | 510/175 |
| 2003/0130149 A1* | 7/2003 | Zhou et al. | ................... | 510/176 |
| 2003/0181344 A1* | 9/2003 | Ikemoto et al. | ............... | 510/175 |
| 2004/0106532 A1* | 6/2004 | Yokoi et al. | ................... | 510/178 |
| 2005/0263743 A1* | 12/2005 | Lee | .............................. | 252/364 |
| 2006/0003910 A1* | 1/2006 | Hsu et al. | ...................... | 510/176 |
| 2006/0094613 A1* | 5/2006 | Lee | .............................. | 510/175 |
| 2006/0115970 A1* | 6/2006 | Lee | .............................. | 438/584 |
| 2007/0027052 A1* | 2/2007 | Yokoi et al. | ................... | 510/175 |
| 2009/0084406 A1* | 4/2009 | Lee et al. | ........................ | 134/18 |

FOREIGN PATENT DOCUMENTS

KR 1020020058995 A 7/2002

* cited by examiner

*Primary Examiner* — Gregory Webb
(74) *Attorney, Agent, or Firm* — F. Chau & Associates, LLC

(57) ABSTRACT

Provided are a composition for removing a photoresist and a method of manufacturing a semiconductor device using the composition. The composition includes about 60-90 wt % of dimethyl sulfoxide, about 10-30 wt % of a polar organic solvent, about 0.5-1.5 wt % of hydroxy alkyl ammonium and about 1-10 wt % of an amine containing no hydroxyl group.

8 Claims, 3 Drawing Sheets

COMPOSITION FOR REMOVING A PHOTORESIST AND METHOD OF MANUFACTURING SEMICONDUCTOR DEVICE USING THE COMPOSITION

CROSS-REFERENCE TO RELATED APPLICATIONS

This U.S. non-provisional patent application claims priority under 35 U.S.C. §119 of Korean Patent Applications No. 10-2010-0031475, filed on Apr. 6, 2010 and Korean Patent Application No. 10-2010-0103531, filed on Oct. 22, 2010, the entire disclosures of which are each hereby incorporated by reference herein in their entireties.

BACKGROUND

The present disclosure herein relates to a composition for removing a photoresist and a method of manufacturing a semiconductor device using the composition.

A photoresist pattern may be used for various masks in, for example, an etching process, ion implantation process, and plating processes during a manufacturing process of a semiconductor device. A photoresist pattern should have excellent adhesion to the layer below, and may require chemical stability against etchants, plating solutions, etc. To perform accurate patterning in an etching process or the like or reduce the time of a plating process, photoresist patterns are being made to have increasingly greater mechanical strength. After a photoresist pattern is used to perform, for example, an etching process, an ion-implantation process, a plating process, a process for removing the photoresist pattern may then be required.

Thus, there is a need in the art for a composition for removing a photoresist, which can readily remove a photoresist pattern while minimizing the corrosion of a metal layer and for a method of manufacturing a semiconductor device using the composition.

SUMMARY

The present disclosure may provide a composition for removing a photoresist, which can readily remove a photoresist pattern while minimizing the corrosion of a metal layer.

The present disclosure may also provide a method of manufacturing a semiconductor device having improved reliability.

Embodiments of the inventive concept provide a composition for removing a photoresist, including: about 60-90 wt % of dimethyl sulfoxide, about 10-30 wt % of a polar organic solvent, about 0.5-1.5 wt % of hydroxy alkyl ammonium and about 1-10 wt % of an amine containing no hydroxyl group.

In some embodiments, the polar organic solvent may be at least one selected from the group consisting of N-methyl-2-pyrolidione (NMP), N-methyl-formamide and dimethylacetamide.

In other embodiments, the hydroxy alkyl ammonium may be tetraalkyl ammonium hydroxide containing an alkyl group with a carbon number of about 1-4.

In still other embodiments, the amine containing no hydroxyl group may be at least one selected from the alkyl amine group consisting of ethylamine, iso-propylamine, diethylenetriamine and ethylenediamine, hexamine, (2-dimethylamine)(methyl)amine, diisopropylethylamine and dimethylbutylamine.

In even other embodiments, the composition for removing a photoresist may further include less than about 1.0 wt % of water.

In yet other embodiments of the inventive concept, a composition for removing a photoresist includes: about 70-75 wt % of dimethyl sulfoxide, about 15-25 wt % of N-methyl-2-pyrolidione (NMP), about 0.70-1.50 wt % of tetramethylammonium hydroxide and about 1.5-5.0 wt % of amine containing no hydroxyl group.

In further embodiments of the inventive concept, a method of manufacturing a semiconductor device includes: forming a photoresist pattern on a substrate and removing the photoresist pattern using a composition for removing a photoresist. The composition for removing the photoresist includes about 60-90 wt % of dimethyl sulfoxide, about 10-30 wt % of a polar organic solvent, about 0.5-1.5 wt % of hydroxy alkyl ammonium and about 1-10 wt % of an amine containing no hydroxyl group.

In still further embodiments, the removing of the photoresist pattern may be performed at a temperature of about 20-70° C.

In still further embodiments, a method of manufacturing a semiconductor device is provided. The method includes forming an interlayer dielectric on a semiconductor substrate, forming a conductive pad on the interlayer dielectric, sequentially forming a first passivation layer and a second passivation layer covering a portion of the interlayer dielectric and exposing a portion of the conductive pad. The method further includes conformally forming a seed layer on substantially the entire surface of the semiconductor substrate on which the first passivation layer and the second passivation layer are formed, forming a photoresist pattern on the seed layer. The photoresist pattern exposes a portion of the seed layer overlapping with the conductive pad. The method further includes forming a barrier layer using a first plating process on a portion of the seed layer which is not covered with the photoresist pattern, forming a bump using a second plating process on the barrier layer and protruding above an upper surface of the photoresist pattern and removing the photoresist pattern using a composition for removing a photoresist. The composition for removing the photoresist includes about 70-75 wt % of dimethyl sulfoxide, about 15-25 wt % of N-methyl-2-pyrolidione (NMP), about 0.70-1.50 wt % of tetramethylammonium hydroxide and about 1.5-5.0 wt % of an amine containing no hydroxyl group.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EXEMPLARY EMBODIMENTS

Figure 1:
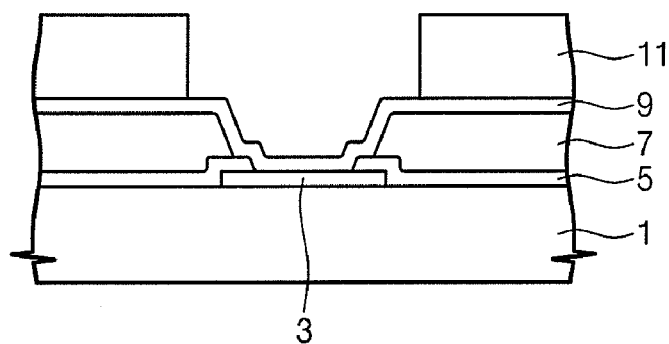
FIGS. 1 through 3 are cross-sectional views illustrating a method of manufacturing a semiconductor device according to an exemplary embodiment of the inventive concept.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the dimensions of layers and regions are exaggerated for clarity of illustration. Further, it will also be understood that when a layer (or film) is referred to as being 'on' another layer or substrate, it can be directly on the other layer or substrate, or intervening layers may also be present. Like reference numerals refer to like elements throughout.

Figure 2:
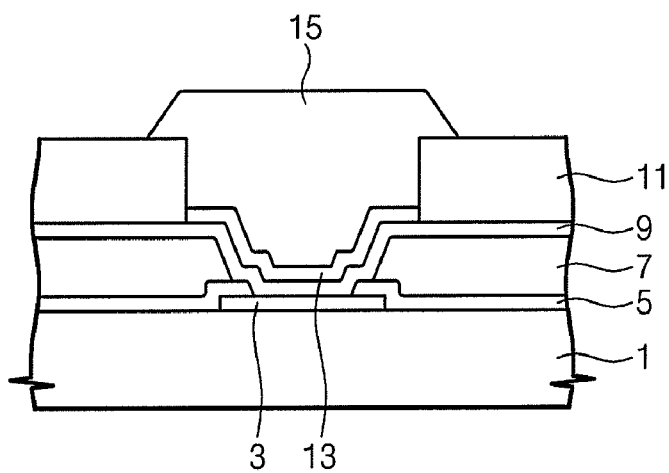
Figure 3:
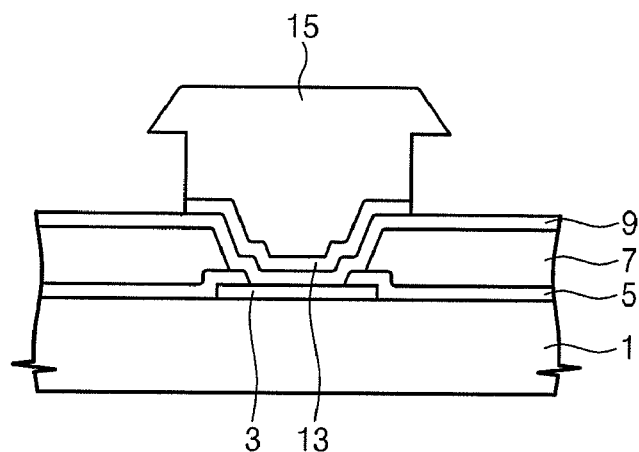

FIGS. 1 through 3 are cross-sectional views illustrating a method of manufacturing a semiconductor device according to an embodiment of the inventive concept.

Referring to FIG. 1, an interlayer dielectric 1 is stacked on a semiconductor substrate (not illustrated), and a conductive pad 3 is formed on the interlayer dielectric 1. Although not shown in the drawings, transistors and interconnections covered with the interlayer dielectric 1 may be formed on the semiconductor substrate. A first passivation layer 5 and a second passivation layer 7, which cover the interlayer dielectric 1 while exposing a portion of the conductive pad 3, are formed. A seed layer 9 is conformally formed on the entire surface of the semiconductor substrate on which the first and the second passivation layers 5 and 7 are disposed. The seed layer 9, for example, may be formed of a copper-containing layer. A photoresist pattern 11 is formed on the seed layer 9. The photoresist pattern 11 is formed to expose the seed layer overlapping with the conductive pad 3. The photoresist pattern 11, for example, may be a positive-type and a negative-type, but may be the negative-type for applying a subsequent high-speed plating method. The negative-type photoresist may contain a crosslinking agent, and polymers in a light-exposed portion may be crosslinked by the crosslinking agent such that the light-exposed portions change to an insoluble chemical state in a developing solution. The negative-type photoresist may have greater mechanical strength than a positive-type photoresist.

Referring to FIG. 2, a barrier layer 13 is formed using a first plating process on the seed layer 9 which is not covered with the photoresist pattern 11. The barrier layer 13 may be formed of, for example, a nickel-containing layer. Using a second plating process, a bump 15, which fills the gap between the photoresist patterns 11, may be formed on the barrier layer 13. The bump 15 may be formed to protrude above the upper surface of the photoresist pattern 11. The second plating process may be performed using, for example, a high-speed plating method. In the high-speed plating method, the temperature of a plating solution may be the same as that of a general plating method, but the current density applied to an electrode may be higher, and the high-speed plating method may be performed under a high concentration state of the plating solution.

Referring to FIG. 3, the photoresist pattern 11 is removed using a composition for removing a photoresist. The composition for removing a photoresist contains about 60-90 wt % of dimethyl sulfoxide, about 10-30 wt % of a polar organic solvent, about 0.5-1.5 wt % of hydroxy alkyl ammonium and about 1-10 wt % of an amine containing no hydroxyl group. The polar organic solvent may be at least one selected from the group consisting of, for example, N-methyl-2-pyrolidione (NMP), N-methyl-formamide and dimethylacetamide. The hydroxy alkyl ammonium may be, for example, tetraalkyl ammonium hydroxide containing an alkyl group with a carbon number of about 1-4. The amine containing no hydroxyl group may be, for example, at least one selected from the group consisting of ethylamine, iso-propylamine, diethylenetriamine and ethylenediamine, hexamine, (2-dimethylamine)(methyl)amine, diisopropylethylamine and dimethylbutylamine. The composition for removing a photoresist may further include less than about 1.0 wt % of water.

The composition for removing a photoresist may include about 70-75 wt % of dimethyl sulfoxide; about 15-25 wt % of N-methyl-2-pyrolidione (NMP); about 0.7-1.50 wt % of tetramethylammonium hydroxide; and about 1.5-5.0 wt % of an amine containing no hydroxyl group.

After removing the photoresist pattern 11 by the same method as the above in FIG. 3, although not shown in the drawings, the seed layer 9 at the side of the bump 15 may be selectively removed to expose the upper surface of the second passivation layer 7.

EXPERIMENTAL EXAMPLE

1. Manufacturing of Composition Solutions for Removing Photoresist

First, the composition solutions for removing a photoresist having 15 compositions (Embodiments 1-5 and Comparative Examples 1-10) described in Table 1 were manufactured.

TABLE 1

| Solution number | Dimethyl sulfoxide (wt %) | Type and content of auxiliary solvent (wt %) | TMAH (wt %) | Solvent dissolving TMAH (methanol) (wt %) | Type and content of amine (wt %) | Water (wt %) |
|---|---|---|---|---|---|---|
| Embodiment 1 | 73.5 | NMP 20.8 | 0.94 | 3.29 | HEXAMINE 1.0 | 0.47 |
| Embodiment 2 | 71.95 | NMP 20.8 | 0.85 | 2.99 | DETA 3.0 | 0.41 |
| Embodiment 3 | 71.1 | NMP 22.0 | 0.98 | 3.41 | EDA 2.0 | 0.51 |
| Embodiment 4 | 73 | NMP 17.25 | 1.15 | 4.08 | DMBA 4.0 | 0.52 |
| Embodiment 5 | 70 | NMP 18.5 | 1.3 | 4.56 | PA 5.0 | 0.64 |
| Comparative example 1 | 96 | 0 | 0.8 | 2.8 | 0 | 0.4 |
| Comparative example 2 | 90 | NMP 5.3 | 0.94 | 3.28 | 0 | 0.48 |
| Comparative example 3 | 86.75 | NMP 10.0 | 0.65 | 2.25 | 0 | 0.35 |
| Comparative example 4 | 49.3 | NMP 47 | 0.74 | 2.59 | 0 | 0.37 |
| Comparative example 5 | 65 | NMP 26.0 | 0.8 | 2.77 | AEEA 5.0 | 0.43 |

TABLE 1-continued

| Solution number | Dimethyl sulfoxide (wt %) | Type and content of auxiliary solvent (wt %) | TMAH (wt %) | Solvent dissolving TMAH (methanol) (wt %) | Type and content of amine (wt %) | Water (wt %) |
|---|---|---|---|---|---|---|
| Comparative example 6 | 73 | BDG 23.0 | 0.8 | 2.6 | 0 | 0.6 |
| Comparative example 7 | 73 | EGME 23.0 | 0.8 | 2.65 | 0 | 0.55 |
| Comparative example 8 | 73 | NMF 23.0 | 0.8 | 2.55 | 0 | 0.65 |
| Comparative example 9 | 72.5 | NMP 17.8 | 0.94 | 3.23 | MEA 5.0 | 0.53 |
| Comparative example 10 | 72.5 | NMP 20.5 | 1 | 0 | EDA 3.0 | 3 |

TMAH: Tetramethylammonium hydroxide
NMP: N-methyl-2-pyrolidione
NMF: N-methyl formamide
BDG: Diethyleneglycolmonobutylether
EGME: Ethyleneglycolmonomethylether
MEA: Monomethanolamine
AEEA: Aminoethylethanolamine
PA: iso-Propylamine
DMBA: N, N-Dimethylbutylamine
HEXAMINE: Hexamethylenetetramine
DETA: Diethylenetriamine
EDA: Ethylenediamine 2. Manufacturing of First Test Wafer Including Positive-type Photoresist A copper layer was formed as a seed layer 9 on the entire surface of a wafer as in FIG. 1. A positive-type novolac-based photoresist is coated to a thickness of about 40 μm, and a photoresist pattern 11 was formed by performing a photolithographic process. A bump 15 consisting of copper was formed by performing a plating process as in FIG. 2. The first test wafer including the positive-type photoresist pattern 11 was formed in 15 pieces under the same process conditions.

3. Manufacturing of Second Test Wafer Including Negative-type Photoresist

A copper layer was formed as a seed layer 9 on the entire surface of a wafer as in FIG. 1. A negative-type acrylate-based photoresist is coated to a thickness of about 40 μm, and a photoresist pattern 11 was formed by performing a photolithographic process. A bump 15 consisting of copper was formed by performing a plating process as in FIG. 2. The second test wafer including the negative-type photoresist pattern 11 was formed in 15 pieces under the same process conditions.

4. Photoresist-removing Ability Evaluation and Copper Etching Amount Measurement While rotating the respective 15 pieces of the first test wafer including the positive-type photoresist at about 200 rpm, the solutions (in Embodiments 1-5 and Comparative Examples 1-10) with the respective compositions presented in Table 1 were sprayed evenly on the first test wafer for about 3 minutes, respectively. The amount of the sprayed solutions was about 3 liters, respectively, and temperature was maintained to about 60° C. Subsequently, a rinse process was performed by spraying ultra-pure water for about 1 minute while rotating the first test wafers at about 500 rpm, respectively. Also, the 15 pieces of the second test wafer including the negative-type photoresist were processed in the same manner as the first test wafers. Subsequently, an optical microscope was used to observe whether the photoresist pattern had been removed or not, and the etching amount of copper was measured by evaluating thickness difference with a 4-probe method. The results are presented in Table 2.

5. Freezing Experiment

About 100 ml of the respective solutions 1-15 was put in a refrigerator maintained at 0° C., and whether or not the respective solutions were frozen was visually confirmed after about 24 hours. The results are presented in Table 2.

6. Result Analysis

TABLE 2

| Solution number | Positive photoresist-removing ability | Negative photoresist-removing ability | Copper etching amount (Å/min, 60° C.) | Whether or not frozen at 0° C. |
|---|---|---|---|---|
| Embodiment 1 | ⊙ | ⊙ | 10 | X |
| Embodiment 2 | ⊙ | ⊙ | 15 | X |
| Embodiment 3 | ⊙ | ⊙ | 10 | X |
| Embodiment 4 | ⊙ | ⊙ | 5 | X |
| Embodiment 5 | ⊙ | ○ | 20 | X |
| Comparative example 1 | ⊙ | ⊙ | 5 | ○ |
| Comparative example 2 | ⊙ | ⊙ | 6 | ○ |
| Comparative example 3 | ⊙ | ○ | 4 | ○ |
| Comparative example 4 | ○ | X | 5 | X |
| Comparative example 5 | ○ | X | 10 | X |

TABLE 2-continued

| Solution number | Positive photoresist-removing ability | Negative photoresist-removing ability | Copper etching amount (Å/min, 60° C.) | Whether or not frozen at 0° C. |
|---|---|---|---|---|
| Comparative example 6 | ○ | X | 30 | X |
| Comparative example 7 | ○ | X | 50 | X |
| Comparative example 8 | ○ | X | 100 | X |
| Comparative example 9 | ⊚ | ○ | 50 | X |
| Comparative example 10 | ○ | X | 100 | X |

(⊚: excellent, ○: good/freezing at standard temperature, X: no removal/no freezing)

Table 2 represents the results of product workability which were evaluated in terms of positive photoresist-removing ability, negative photoresist-removing ability and stripper performance characteristics of the copper etching amount, and whether or not the solutions were frozen at 0° C. for the respective 15 solutions corresponding to Embodiments 1-5 and Comparative examples 1-10.

Figure 4:
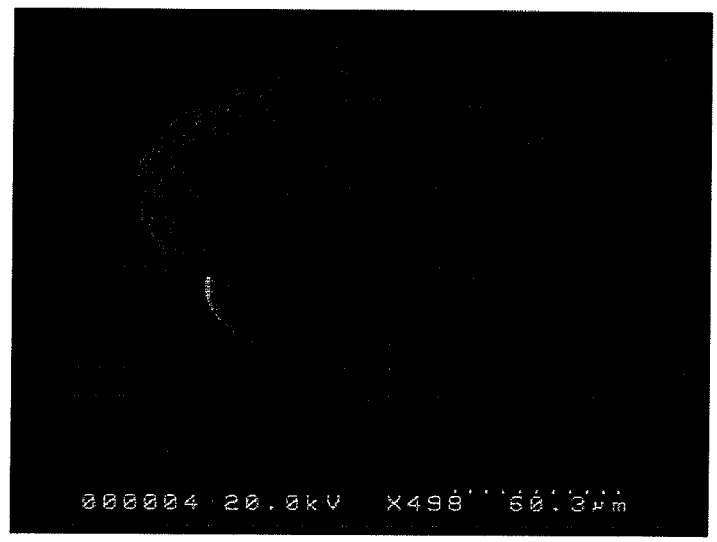
FIG. 4 is an electron micrograph taken after removing a negative-type photoresist using the composition solution corresponding to an exemplary embodiment.

In Tables 1 and 2, the solution corresponding to Embodiment 1 has a composition consisting of about 73.5 wt % of dimethyl sulfoxide, about 20.8 wt % of N-methyl-2-pyrolidione, about 0.94 wt % of TMAH and about 1.0 wt % of hexamine, and as the result of experiments, the copper etching amount is about 10 Å/min which is good, and freezing is not presented at 0° C. and the removal of both of the positive and negative photoresists are relatively easy. It may also be confirmed by FIG. 4 that the removal of the negative photoresist and copper etching were absent.

The solution corresponding to Embodiment 2 has a composition consisting of about 71.95 wt % of dimethyl sulfoxide, about 20.8 wt % of N-methyl-2-pyrolidione, about 0.85 wt % of TMAH and about 3.0 wt % of diethylenetriamine, and as the result of experiments, the copper etching amount is about 15 Å/min which is favorable, and freezing is not presented at 0° C. and the removal of both of the positive and negative photoresists are relatively easy.

The solution corresponding to Embodiment 3 has a composition consisting of about 71.1 wt % of dimethyl sulfoxide, about 22.0 wt % of N-methyl-2-pyrolidione, about 0.98 wt % of TMAH and about 2.0 wt % of ethylenediamine, and as the result of experiments, the copper etching amount is about 10 Å/min which is good, and freezing is not presented at 0° C. and the removal of both of the positive and negative photoresists are relatively easy.

The solution corresponding to Embodiment 4 has a composition consisting of about 73 wt % of dimethyl sulfoxide, about 17.25 wt % of N-methyl-2-pyrolidione, about 1.15 wt % of TMAH and about 4.0 wt % of dimethylbutylamine, and as the result of experiments, the copper etching amount is about 5 Å/min which is excellent, and freezing is not presented at 0° C. and the removal of both of the positive and negative photoresists are relatively easy.

The solution corresponding to Embodiment 5 has a composition consisting of about 70 wt % of dimethyl sulfoxide, about 18.5 wt % of N-methyl-2-pyrolidione, about 1.3 wt % of TMAH and about 5.0 wt % of iso-propylamine, and as the result of experiments, the copper etching amount is about 20 Å/min which is favorable, and freezing is not presented at 0° C. and the removal of both of the positive and negative photoresists are relatively easy.

Five solutions corresponding to Embodiments 1-5 contain about 70-75 wt % of dimethyl sulfoxide, about 17-22 wt % of N-methyl-2-pyrolidione, about 0.85-1.3 wt % of TMAH and about 1-5 wt % of an amine containing no hydroxyl group. The amine containing no hydroxyl group may be alkyl amines such as, for example, hexamethylenetetramine, diethylenetriamine, ethylenediamine, dimethylbutylamine, iso-propylamine and the like. Five solutions corresponding to Embodiments 1-5 are compared with ten solutions corresponding to Comparative Examples 1-10 described below.

Figure 5:
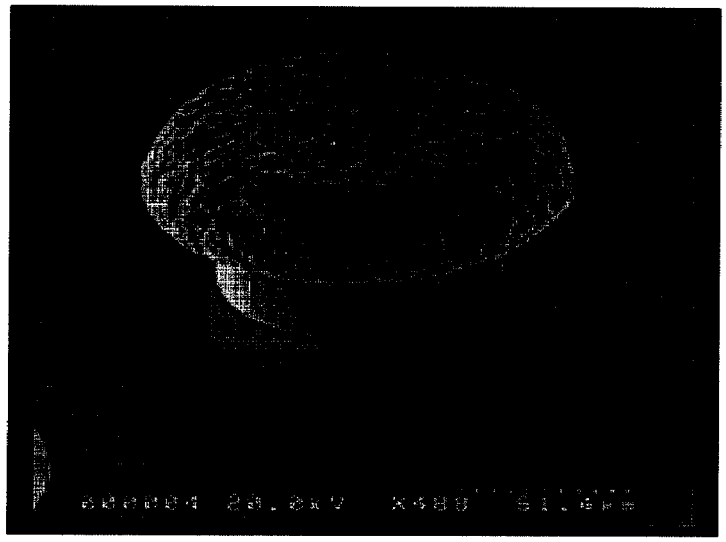
FIG. 5 is an electron micrograph taken after removing a negative-type photoresist using the solution corresponding to Comparative Example 3.

In the case of three solutions corresponding to Comparative Examples 1-3, the removal of both of the positive and negative photoresists are relatively easy, and the copper etching amount is about 4-6 Å/min which is excellent, but the content of dimethyl sulfoxide with about a 18° C. freezing point is high and the amine compound is absent, thereby freezing at 0° C. Therefore, in the case where these solutions are transported and stored outdoors in the winter, the solutions may be frozen. As a result, a container storing the solutions may shrink/expand so that the storage container may be deformed, and the freezing/thawing of the solutions is repeated so that the composition may be changed and the performance may be deteriorated. FIG. 5 is an electron micrograph taken after removing the negative photoresist using the solution corresponding to Comparative Example 3. Referring to FIG. 5, it may be confirmed that a portion of the negative-type photoresist residue remains at the point indicated by an arrow.

The solution corresponding to Comparative Example 4 contains about 49.3 wt % of dimethyl sulfoxide and about 47 wt % of N-methyl-2-pyrolidione with low freezing temperature, thereby enabling a solution to the freezing difficulty at 0° C., and the removing ability of the positive and negative photoresists was not good, although a small copper etching amount was observed.

The solution corresponding to Comparative Example 5 contains about 65 wt % of dimethyl sulfoxide, about 26.0 wt % of N-methyl-2-pyrolidione and about 5 wt % of aminoethylethanolamine containing a hydroxylamine group, and the negative photoresist was not removed.

The solutions corresponding to Comparative Examples 6-8 contain about 73 wt % of dimethyl sulfoxide, about 0.8 wt % of TMAH and about 23 wt % of diethyleneglycolmonobutylether, ethyleneglycolmonomethyl ether and N-methylformamide as auxiliary solvents, respectively, and the negative photoresist was not removed. Also, the solutions corresponding to Comparative Examples 6-8 are not desirable because the copper etching amounts are high at about 30 Å/min, about 50 Å/min and about 100 Å/min, respectively.

Figure 6:
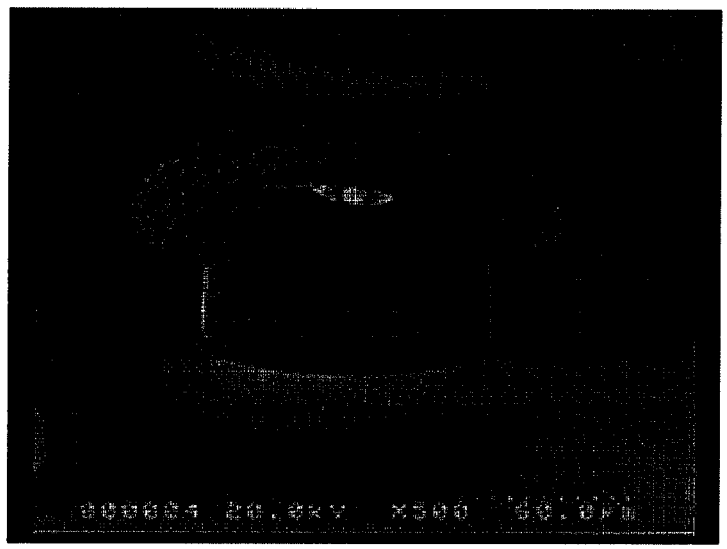
FIG. 6 is an electron micrograph taken after removing a negative-type photoresist using the solution corresponding to Comparative Example 9.

The solution corresponding to Comparative Example 9 has a composition similar to the compositions of embodiments. That is, the solution corresponding to Comparative Example 9 contains about 72.5 wt % of dimethyl sulfoxide, about 17.8 wt % of N-methyl-2-pyrolidione, about 0.94 wt % of TMAH and about 5.0 wt % of monomethanolamine containing a hydroxyl group. In the solution corresponding to Comparative Example 9, as compared to the solutions of embodiments, the positive photoresist-removing ability is the same, but the negative photoresist-removing ability is reduced, and it may also be found that the copper etching amount is about 50 Å/min which is greatly increased. FIG. 6 is an electron micrograph taken after removing the negative-type photoresist using the solution corresponding to Comparative Example 9. Referring to FIG. 6, it may be known that photoresist residue remains at the point indicated by an arrow, and corrosion occurred inside a dotted line of a circle.

Finally, the solution corresponding to Comparative Example 10 contains about 72.5 wt % of dimethyl sulfoxide, about 20.5 wt % of N-methyl-2-pyrolidione, about 1 wt % of TMAH, about 3 wt % of the ethylenediamine used in the solution of Example 3 and about 3 wt % of water, wherein water is chosen as a solution for dissolving TMAH. In this case, as compared to Embodiment 3, the positive-type photoresist-removing ability and the negative-type photoresist-removing ability may all be reduced, and it may be found that the copper etching amount increases about 10 times. That is, since the content of water added in the solution may increase, it may be known that the removing ability of the photoresist may be reduced and the copper etching amount may increase.

In summary, through Tables 1 and 2, it may be known that the difficulty of freezing at 0° C. may be solved when about 70-75 wt % of dimethyl sulfoxide and about 17-22 wt % of the auxiliary solvents are applied. Also, it may be understood that the application of N-methyl-2-pyrolidione and an amine containing no hydroxyl group may improve the removing ability of the positive-type and negative-type photoresists, and corrosiveness to copper, which may occur during a process, may also be reduced.

In conclusion, it may be known that a composition for removing a photoresist according to the above experimental results contains about 60-90 wt % of dimethyl sulfoxide, about 10-30 wt % of the polar organic solvent, about 0.5-1.5 wt % of hydroxy alkyl ammonium and about 1-10 wt % of an amine containing no hydroxyl group. Also, referring to the solutions corresponding to Embodiments 1-5 that have excellent results, the composition for removing a photoresist may contain about 70-75 wt % of dimethyl sulfoxide; about 15-25 wt % of N-methyl-2-pyrolidione (NMP); about 0.70-1.50 wt % of tetramethylammonium hydroxide; and about 1.5-5.0 wt % of an amine containing no hydroxyl group. The composition for removing a photoresist may further include water in an amount of less than about 1.0 wt %.

The composition for removing a photoresist may be used for removing a thick photoresist pattern during a process of forming a through via as well as forming a bump electrode.

The composition for removing a photoresist according to the inventive concept may minimize the corrosion of metal, and may also selectively and cleanly remove a negative-type photoresist pattern with improved mechanical strength as well as positive-type photoresist. Also, the composition for removing a photoresist according to the inventive concept may not freeze at 0° C., thus enabling it to be transported and stored outdoors in cold winter conditions. When the composition for removing a photoresist is used to remove a photoresist pattern, the photoresist may be efficiently and cleanly removed in a relatively short time at low temperatures while minimizing corrosion of metal, thereby enabling manufacture of a semiconductor memory device with improved reliability.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A composition for removing a photoresist, comprising:
   about 60-90 wt % of dimethyl sulfoxide;
   about 10-30 wt % of a polar organic solvent;
   about 0.5-1.5 wt % of hydroxy alkyl ammonium; and
   about 1-10 wt % of an amine containing no hydroxyl group.

2. The composition of claim 1, wherein the polar organic solvent is at least one selected from the group consisting of N-methyl-2-pyrolidione (NMP), N-methyl-formamide and dimethylacetamide.

3. The composition of claim 1, wherein the hydroxy alkyl ammonium is tetraalkyl ammonium hydroxide including an alkyl group with a carbon number of about 1-4.

4. The composition of claim 1, wherein the amine containing no hydroxyl group is at least one selected from the alkyl amine group consisting of ethylamine, iso-propylamine, diethylenetriamine and ethylenediamine, hexamine, (2-dimethylamine)methyl)amine, diisopropylethylamine and dimethylbutylamine.

5. The composition of claim 1, further comprising less than about 1.0 wt % of water.

6. The composition of claim 1, wherein,
   the dimethyl sulfoxide is included in the amount of about 70-75 wt %;
   the polar organic solvent is N-methyl-2-pyrolidione (NMP) included in amount of about 15-25 wt %;
   the hydroxy alkyl ammonium is tetramethylammonium hydroxide included in an amount of about 0.70-1.50 wt %; and
   the amine containing no hydroxyl group is included in an amount of about 1.5-5.0 wt %.

7. The composition of claim 6, wherein the amine containing no hydroxyl group is at least one selected from the alkyl amine group consisting of ethylamine, iso-propylamine, diethylenetriamine and ethylenediamine, hexamine, (2-dimethylamine)(methyl)amine, diisopropylethylamine and dimethylbutylamine.

8. The composition of claim 6, further comprising less than about 1.0 wt % of water.

* * * * *